United States Patent
Irish

(10) Patent No.: US 11,462,915 B2
(45) Date of Patent: *Oct. 4, 2022

(54) SOLAR CHARGE CONTROLLER ADAPTABLE FOR MULTIPLE SOLAR SUBSTRING CHEMISTRIES AND CONFIGURATIONS

(71) Applicant: Optivolt Labs, Inc., Burlingame, CA (US)

(72) Inventor: Linda Irish, Burlingame, CA (US)

(73) Assignee: Optivolt Labs, Inc., Burlingame, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/542,222

(22) Filed: Dec. 3, 2021

(65) Prior Publication Data

US 2022/0102983 A1 Mar. 31, 2022

Related U.S. Application Data

(63) Continuation of application No. 17/484,615, filed on Sep. 24, 2021.

(Continued)

(51) Int. Cl.
*H02J 3/38* (2006.01)
*H02J 3/26* (2006.01)
(Continued)

(52) U.S. Cl.
CPC ........ *H02J 3/381* (2013.01); *G01R 19/16538* (2013.01); *G05F 1/67* (2013.01);
(Continued)

(58) Field of Classification Search
CPC .... H02J 3/382; H02J 3/26; H02J 3/385; H02J 7/0016; H02J 2300/26; H02J 13/0006;
(Continued)

(56) References Cited

U.S. PATENT DOCUMENTS

2001/0023703 A1 9/2001 Kondo et al.
2011/0199707 A1 8/2011 Kazemi et al.
(Continued)

FOREIGN PATENT DOCUMENTS

WO 2020081215 A1 4/2020

OTHER PUBLICATIONS

International Search Report and Written Opinion for International Patent Application No. PCT/US2021/051985 dated Dec. 13, 2021, 11 pages.

(Continued)

*Primary Examiner* — Hal Kaplan
(74) *Attorney, Agent, or Firm* — Run8 Patent Group, LLC; Peter Miller; Alexander Rodriguez

(57) ABSTRACT

A system for balancing voltages in solar substrings in a first solar panel includes an inductive balancer circuit. The inductive balancer circuit includes a first power level pair and a second power level pair each coupled to the solar substring, and including: a pair of switches arranged in series; a pair of capacitors arranged in series and connected in parallel to the first pair of switches; and an inductor arranged between the first pair of switches and the first pair of capacitors. The system further includes a controller coupled to the inductive balancer circuit and configured to: oscillate states of the pair of switches at a duty cycle; balance voltages across the first power level pair and the second power level pair; and generate a total voltage output that is a multiple of a nominal operating voltage of a most-illuminated solar substring.

20 Claims, 4 Drawing Sheets

Related U.S. Application Data

(60) Provisional application No. 63/083,817, filed on Sep. 25, 2020.

(51) Int. Cl.
    *H02S 40/36*     (2014.01)
    *G05F 1/67*     (2006.01)
    *G01R 19/165*     (2006.01)
    *H02S 40/34*     (2014.01)
    *H02J 7/00*     (2006.01)

(52) U.S. Cl.
    CPC .............. *H02J 3/26* (2013.01); *H02J 7/0016* (2013.01); *H02S 40/34* (2014.12); *H02S 40/36* (2014.12); *H02J 2300/26* (2020.01)

(58) Field of Classification Search
    CPC ... H02S 40/34; H02S 40/36; G01R 19/16538; G05F 1/67
    USPC ........................................................ 307/78
    See application file for complete search history.

(56) References Cited

U.S. PATENT DOCUMENTS

| | | |
|---|---|---|
| 2013/0320911 A1 | 12/2013 | Kamiya et al. |
| 2017/0366018 A1* | 12/2017 | Von Novak ........... H02J 7/0016 |
| 2018/0069490 A1 | 3/2018 | Fu |
| 2018/0233614 A1 | 8/2018 | Dai et al. |
| 2018/0374965 A1 | 12/2018 | Ledenev et al. |
| 2020/0081215 A1 | 3/2020 | Maricevic et al. |

OTHER PUBLICATIONS

International Search Report and Written Opinion for International Patent Application No. PCT/US2021/041699 dated Oct. 20, 2021, 17 pages.

* cited by examiner

US 11,462,915 B2

SOLAR CHARGE CONTROLLER ADAPTABLE FOR MULTIPLE SOLAR SUBSTRING CHEMISTRIES AND CONFIGURATIONS

CROSS-REFERENCE TO RELATED APPLICATIONS

This application is a continuation application of U.S. patent application Ser. No. 17/484,615, filed on 24 Sep. 2021, which claims the benefit of U.S. Provisional Application No. 63/083,817, filed on 25 Sep. 2020, and is entitled "Solar Charge Controller Adaptable for Multiple Solar Substring Chemistries and Configurations", which is incorporated in its entirety by this reference.

TECHNICAL FIELD

This invention relates generally to the field of solar power systems and more specifically to a new and useful solar charge controller adaptable for multiple solar substring chemistries and configurations in the field of solar power systems.

DESCRIPTION OF THE EMBODIMENTS

Figure 1:
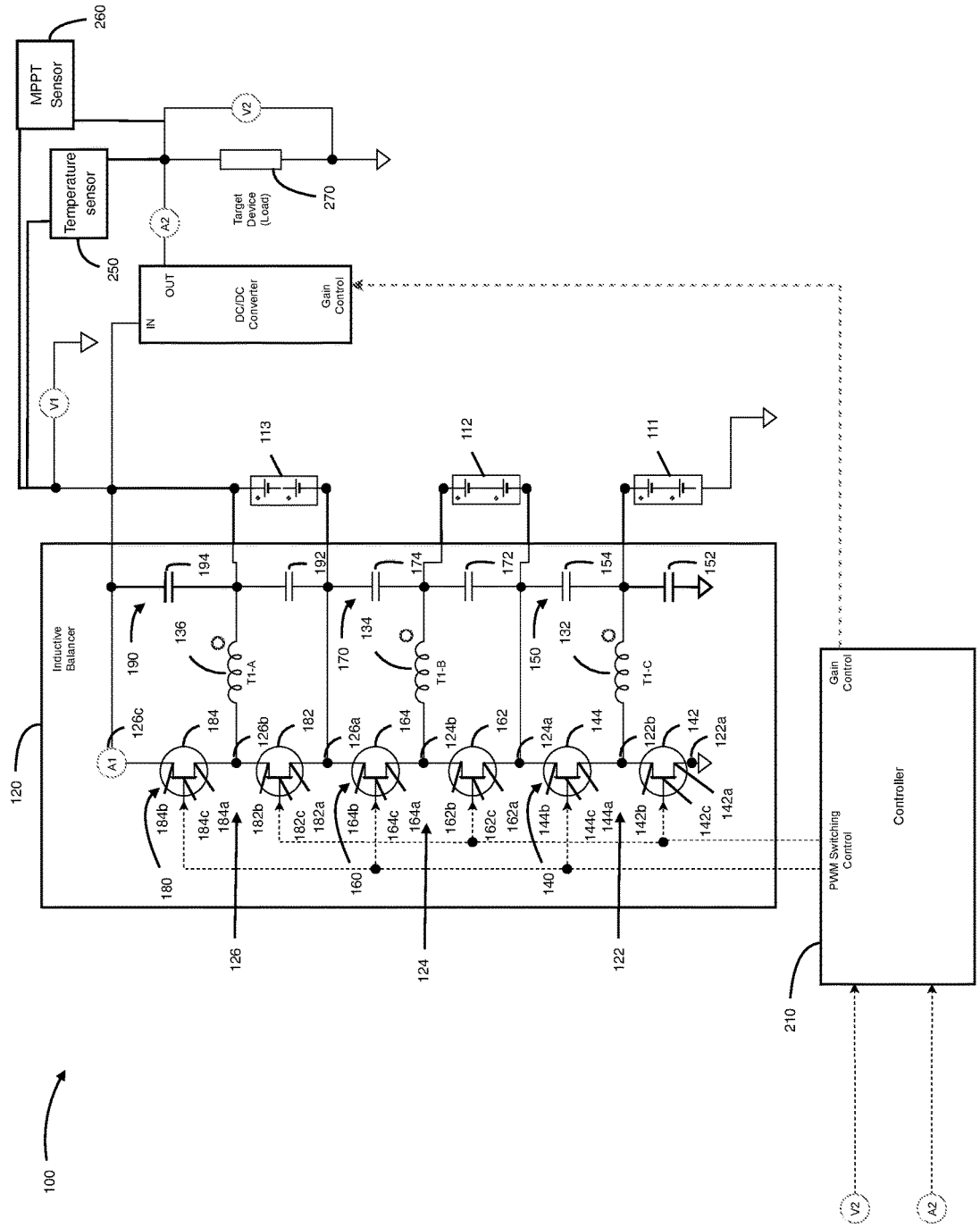
FIG. 1 is a schematic representation of an example implementation of a system.

The following description of embodiments of the invention is not intended to limit the invention to these embodiments but rather to enable a person skilled in the art to make and use this invention. Variations, configurations, implementations, example implementations, and examples described herein are optional and are not exclusive to the variations, configurations, implementations, example implementations, and examples they describe. The invention described herein can include any and all permutations of these variations, configurations, implementations, example implementations, and examples.

1. System

As shown in FIGS. 1-4, a system 100 is configured to interface with and to balance power output by a set of solar substrings, which can experience uneven illumination—and therefore uneven power output—throughout operation. For example, the system 100 can define a power controller 210 configured to interface with and to balance power output by a set of solar substrings: arranged on multiple facets of a pitched residential roof; arranged on a flat roof shaded by nearby trees or other buildings; arranged on a vehicle rooftop; or otherwise arranged on or across two or more non-parallel surfaces and/or exposed to variable shading.

In particular, when a set of solar substrings (e.g., individual solar cells, groups of solar cells in a solar substring)—connected in series—are not uniformly illuminated, the total output current from the set of solar cells is limited to the current through the lowest-output solar cell in the set. Therefore, rather than implement a bypass diode to route current from a higher-output solar substring around a lower-output solar substring, the system 100 can include: a set of power level pairs, each connected to one solar substring (e.g., in a half-level voltage boost configuration) or to two solar substrings (e.g., in a full-level voltage balancing configuration); a pair of switches and capacitors within each power level pair; and a transformer 130 that includes one winding per power level pair. As a controller 210 in the system 100 alternates states of transistor pairs within each change pump in these power level pairs, the windings within the transformer 130 can couple to force a common voltage—equal to a maximum voltage across any one solar substring in the set—across each power level, thereby boosting the total voltage output of the system 100 and solar substrings to a multiple of the nominal operating voltages of the solar substrings, even if some or most of these solar substrings are shaded or inconsistently illuminated. Beyond balancing the voltages across each power level, the windings also store energy output by the solar substrings in the lower power levels and then transform this stored energy into current output from the last power level to a load 270, thereby isolating the total current output (and thus total power output) of the system 100 from current throughput limitations of a single least-illuminated solar substring in the set.

Therefore, each power level pair: includes a pair of switches (e.g., transistor) arranged in series; a pair of capacitors arranged in series and connected in parallel to the pair of switches; and a winding of a transformer 130 interposed between the switches and capacitors, cooperating with the pair of switches and capacitors to balance voltages across the two power levels within the power level pair, configured to store energy output by solar substrings connected to multiple power level pairs, and configured to output current to a load 270 (e.g., via a last power level in the system 100) as a function of the sum of the energy output by all solar substrings in the set. More specifically, the system 100 includes a transformer 130 connected across a set of power levels and a controller 210 configured to oscillate states of transistors within each power level to produce: a total voltage output that is a multiple of a nominal operating voltage of a most-illuminated solar substring connected to the system 100; and a total output power that is a combination of (e.g., a sum) of the individual output powers of each connected solar substring—and not limited to the power output or current throughput of a single least-illuminated solar substring in the set.

Furthermore, by balancing mismatched output currents from a set of solar substrings, the system 100 can interface solar substrings of two different solar cell chemistries—such as perovskite and silicon, which can exhibit different output voltages (and different output powers) under identical illumination conditions—connected to each power level pair. In this configuration, the controller 210 can vary the duty cycle at which transistors in the power level pairs are switched in order to maintain each solar cell chemistry at its nominal operating voltage even if only one solar substring and/or one solar cell chemistry connected to the system 100 is illuminated or otherwise outputting power.

In one variation of the exemplary implementation depicted in FIG. 1, the system 100 can include an inductive balancer circuit 120. The inductive balancer circuit 120 can include a first power level pair 122 coupled to a first solar substring 111 including: a first pair of switches 140 arranged in series; a first pair of capacitors 150 arranged in series and connected in parallel to the first pair of switches 140; and a first winding 132 or inductor arranged in between the first pair of switches 140 and the first pair of capacitors 150. The inductive balancer circuit 120 can also include a second power level pair 124 coupled to a second solar substring 112 including: a second pair of switches 160 arranged in series; a second pair of capacitors 170 arranged in series and connected in parallel to the second pair of switches 160; and a second winding 134 or inductor arranged between the second pair of switches 160 and the second pair of capacitors 170, connected to the first pair of switches 140 and the first pair of capacitors 150. The system 100 can further include a controller 210 coupled to the inductive balancer circuit 120 and configured to initiate a balancing cycle. During the balancing cycle, the controller 210 can: oscillate states of the first pair of switches 140 and the second pair of switches 160 at a first duty cycle; balance voltages across the first power level pair 122 and the second power level pair 124; and generate a total voltage output that is a multiple of a nominal operating voltage of a most illuminated solar substring.

Figure 2:
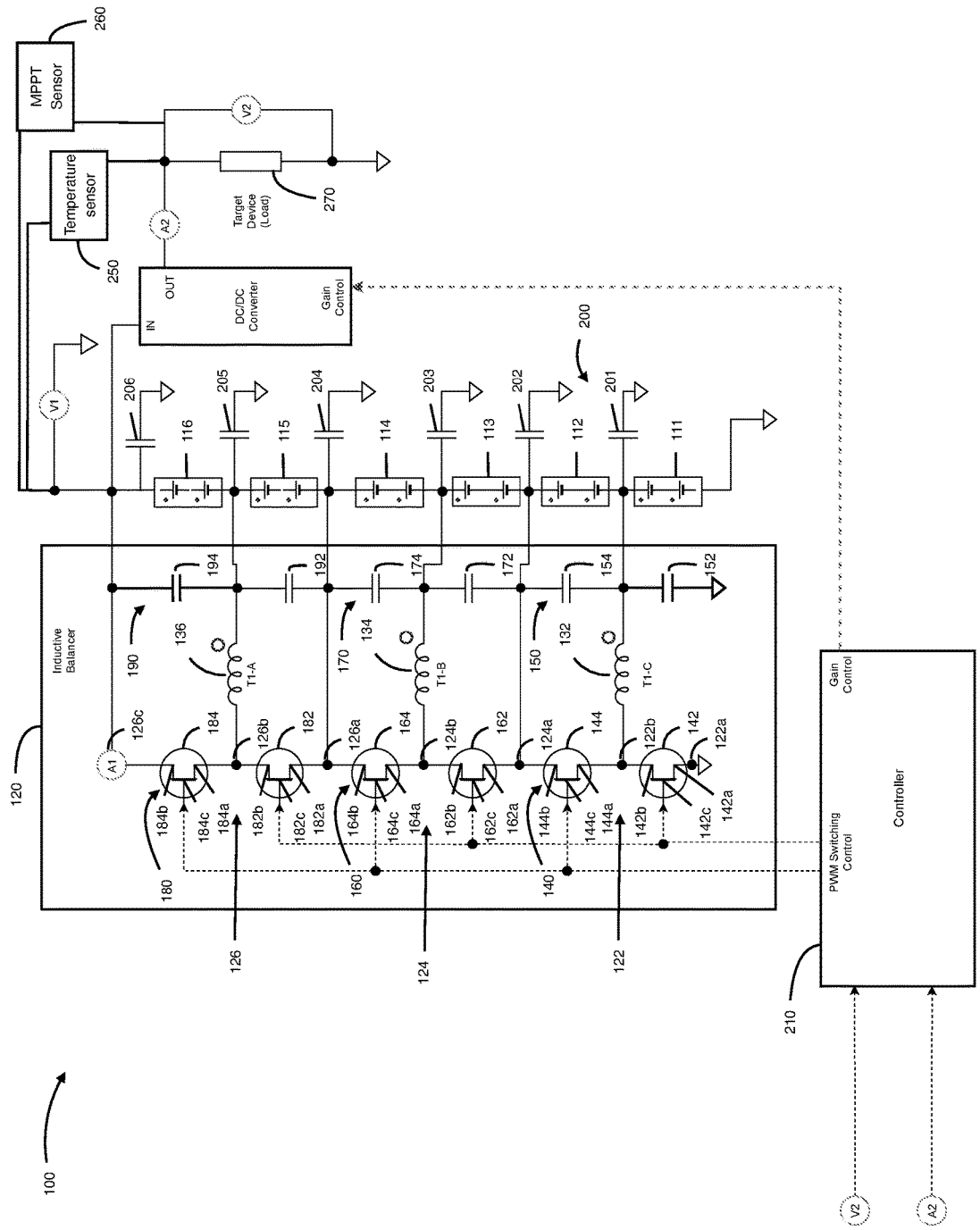
FIG. 2 is a schematic representation of an example implementation of the system.

In one variation of the exemplary implementation depicted in FIG. 2, the system 100 can include: a first solar substring in and a second solar substring 112 defining a first pair of solar panel substrings; and a third solar substring 113 and a fourth solar substring 114 defining a second pair of solar panel substrings. The system 100 can also include an inductive balancer circuit 120. The inductive balancer circuit 120 can include a first power level pair 122 coupled to the first pair of solar substrings including: a first pair of switches 140 arranged in series; a first pair of capacitors 150 arranged in series and connected in parallel to the first pair of switches 140; and a first winding 132 or inductor arranged in between the first pair of switches 140 and the first pair of capacitors 150. The inductive balancer circuit 120 can also include a second power level pair 124 coupled to the second pair of solar substrings including: a second pair of switches 160 arranged in series; a second pair of capacitors 170 arranged in series and connected in parallel to the second pair of switches 160; and a second winding 134 or inductor arranged between the second pair of switches 160 and the second pair of capacitors 170, connected to the first pair of switches 140 and the first pair of capacitors 150. The system 100 can further include a controller 210 coupled to the inductive balancer circuit 120 and configured to initiate a balancing cycle. During the balancing cycle the controller 210 can: oscillate states of the first pair of switches 140 and the second pair of switches 160 at a first duty cycle; balance voltages across the first power level pair 122 and the second power level pair 124; induce a fixed voltage boost ratio; and generate a total voltage output as a function of the ratio of each of the first power level pair 122, second power level pair 124, and the first duty cycle.

Figure 3:
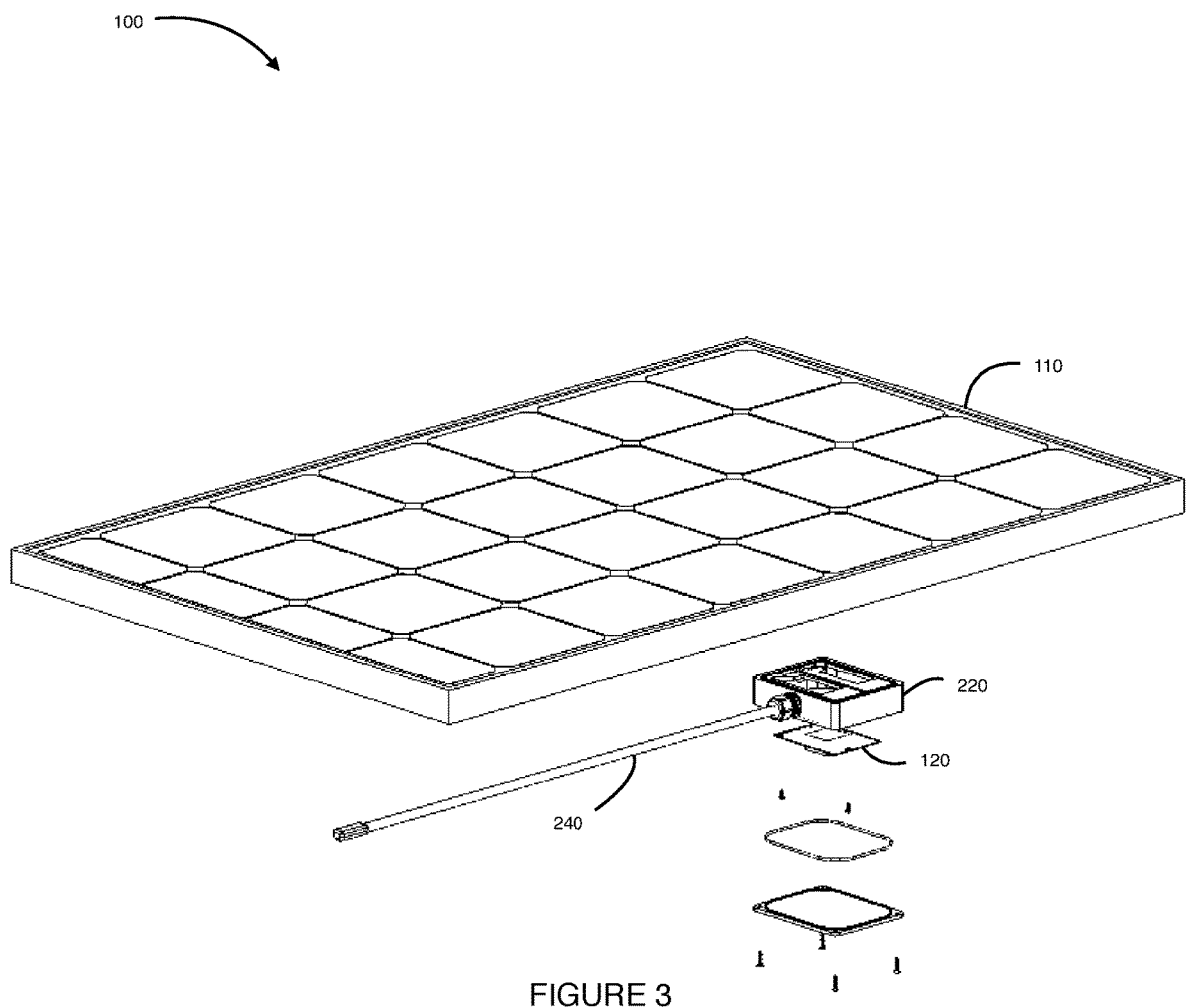
FIG. 3 is a graphical representation of an example implementation of the system.
Figure 4:
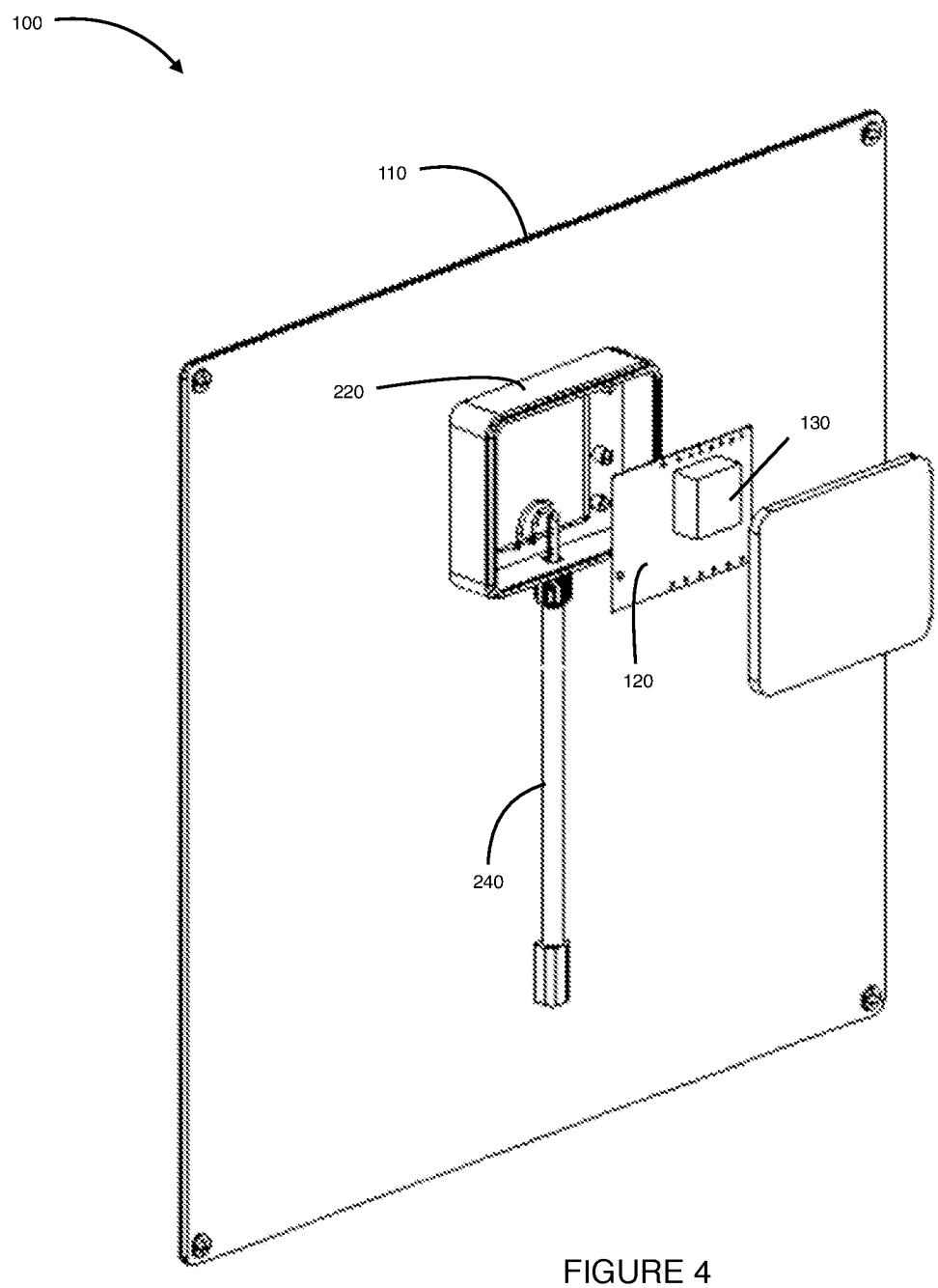
FIG. 4 is a schematic representation of an example implementation of the system.

In one variation of the exemplary implementation depicted in FIGS. 3-4, the system 100 can include a solar panel 110 including a set of solar substrings and defining a front face and a rear face. The system 100 can also include: a housing structure 220 arranged on the rear face of the solar panel 110; and a rod structure 240 extending outwardly from a side end of the housing and coupled to the solar panel 110. The housing structure 220 can include: an inductive balancer circuit 120; and a controller 210 coupled to the inductive balancer circuit 120; each of the inductive balancer circuit 120 and the controller 210 enclosed within the housing structure 220.

2. Applications

In a voltage boost ratio configuration depicted in FIG. 2, the system 100 is connected to a set of solar substrings at only a subset of power level pairs. Each power level pair and the transformer 130 similarly cooperate to: balance the voltages across every power level, including the unpopulated power levels; produce a fixed voltage boost ratio and consistent voltage output as a function of the ratio of populated to total power levels and the duty cycle of the transistors; accumulate energy output by the solar substrings connected to the subset of power levels; and transform this energy into a current output to a load 270 without a least-illuminated solar substring in the set limiting the total current output.

In a half-level configuration depicted in FIG. 1, each power level pair in the same system 100 is connected to a single solar substring. In this configuration, each power level pair and the transformer 130 similarly cooperate to: drive the voltage across each solar substring to a common operating voltage equal to the maximum voltage across any solar substring connected to the system 100; accumulate energy output by the solar substrings connected to the subset of power levels; and transform this energy into a current output to a load 270 without a least-illuminated solar substring in the set limiting the total current output. In this configuration, the controller 210 can also vary the duty cycle at which transistors in the power level pairs are switched in order to drive the voltage across each unpopulated power level to a controlled voltage greater than, less, than, or equal to the common operating voltage across the solar substrings, thereby controlling the total output voltage of the system 100, which is a sum of the voltages across each populated and unpopulated power level.

Therefore, the system 100 can define a singular power controller 210 configured to connect to multiple solar substrings: up to a total number of power levels in the system 100; of a single solar cell chemistry or of two different solar cell chemistries; and in various configurations. In these configurations, the system 100 can enable different fixed voltage boost ratios, load 270 balancing across different solar cell chemistries, and/or direct maximum power point tracking, etc. merely by varying a duty cycle at which transistors in the power level pairs are switched.

The system 100 is described herein as a discrete power controller 210 configured to connect to a set of external solar substrings, each including one or more solar cells of one solar cell chemistry and connected in parallel or in series. However, the system 100 can alternatively be integrated into one solar panel 110 (e.g., installed within or connected to a rigid housing of the solar panel 110) and connected to a set of solar cells and/or solar substrings arranged within the solar panel 110.

3. Solar Substring Power Output Variance

Generally, a group of solar substrings can exhibit non-uniform power output over time due to changes in solar illumination, shading, and local reflectance (hereinafter "illumination"). Illumination profiles of groups of solar substrings can also vary greatly across different geographic locations and different solar substring installation orientations. For example, a group of solar substrings can be installed on a flat roof, across multiple non-parallel facets of a pitched roof, on a roof of a passenger vehicle, or in an open field. Groups of solar substrings in these installations can therefore be exposed to significantly different illumination profiles over time, and solar substrings within each group can be illuminated and shaded differently and can therefore output significantly different power magnitudes at any given time.

The system 100 can therefore include power electronics configured to condition and merge outputs of these solar substrings—which can be nearly identical (e.g., 300 Watts each) within certain daily time windings (e.g., midday) and very different (e.g., between 50 Watts and 500 Watts) at other times of day (e.g., early afternoon)—into one common higher-voltage, higher-current output.

For example, for a solar installation containing multiple solar substrings arranged on different facets of a pitched roof, an east-facing solar substring in the solar installation can receive predominant illumination, the south-facing solar substring in the solar installation can receive some illumination, and the west-facing solar substring in the solar installation can receive minimal illumination (e.g., from reflection) from sunrise through mid-morning (e.g., 5AM until 10 AM). Therefore, in this example: the east-facing solar substring can generate an average of Watts and a peak of 200 Watts of power at an average operating voltage of 1.12 Volts during this morning period; the south-facing solar substring can generate an average of 50 Watts and a peak of 200 Watts of power at an average operating voltage of 1.09 Volts during this morning period; and the west-facing solar substring can generate an average of 5 Watts and a peak of 20 Watts of power at an average operating voltage of 1.0 Volt during this morning period if these solar substrings are disconnected and operated independently. If these solar substrings are connected in series without the multi-winding transformer 130, the total output of the set of solar substrings can drop to an average of 5 Amps over 3.21 Volts and 16 Watts output power.

In the foregoing example, the east-facing solar substring can receive some illumination (e.g., from both reflection and direct illumination), the south-facing solar substring can receive predominant illumination, and the west-facing solar substring can receive some illumination from mid-morning to mid-afternoon (e.g., 10 AM until 3 PM). Therefore, the east-facing solar substring can generate an average of 150 Watts and a peak of 300 Watts of power at an average operating voltage of 1.15 Volts during this midday period; the south-facing solar substring can generate an average of 300 Watts and a peak of 350 Watts of power at an average operating voltage of 1.2 Volts during this midday period; and the west-facing solar substring can generate an average of 150 Watts and a peak of 300 Watts of power at an average operating voltage of 1.15 Volts during this midday period if these solar substrings are disconnected and operated independently. If these solar substrings are connected in series without the multi-winding transformer 130, the total output of the set of solar substrings can drop to an average of 130 Amps over 3.5 Volts and 456 Watts of output power.

Furthermore, in this example, the east-facing solar substring can receive minimal illumination (e.g., from reflection), the south-facing solar substring can receive some illumination, and the west-facing solar substring can receive predominant illumination from mid-afternoon to dusk (e.g., 3 PM until 8 PM). Therefore, in this example: the east-facing solar substring can generate an average of 5 Watts and a peak of 20 Watts of power at an average operating voltage of 1.0 Volt during this evening period; the south-facing solar substring can generate an average of 50 Watts and a peak of 200 Watts of power at an average operating voltage of 1.09 Volts during this evening period; and the west-facing solar substring can generate an average of Watts and a peak of 200 Watts of power at an average operating voltage of 1.12 Volts during this evening period. If these solar substrings are connected in series without the multi-winding transformer 130, the total output of the set of solar substrings can drop to an average of 5 Amps over 3.21 Volts and 16 Watts of output power.

Therefore, the effective operating voltage and power output of the east-, south-, and west-facing solar substring can vary significantly over time during a single day and can differ significantly between solar substrings (e.g., by up to 200 Watts and 0.2 Volts between two solar substrings at any single instant in time). Furthermore, differences in output power and current from these solar substrings under uneven illumination can significantly reduce total power output of the set of solar substrings arranged in series.

Thus, the set of solar substrings can be connected to the system 100 in series—such as with each power level pair in the system 100 connected to one solar substring in the set—in order to achieve a total output voltage equal to a multiple of the nominal output voltage of these individual solar substrings. The controller 210 (e.g., including a gate drive, clock, etc.) in the system 100 can then modulate the duty cycle at which transistors in these power level pairs are switched in order to match this total output voltage of the system 100 to a target output voltage to a connected load 270. The system 100 can also include a multi-winding transformer 130 that accumulates energy output by all of these solar substrings and transforms this energy into a current output from a last power level in the system 100, thereby avoiding transmission of current from one solar substring to a next solar substring in the series, which can otherwise limit total current throughout and thus total power output from the set of solar substrings.

Accordingly, the system 100 can control and maintain output total voltage from the set of solar substrings even in partial shading and varying illumination conditions while also achieving greater total output power from these solar substrings, thereby enabling the solar installation to supply greater power to a load 270 for a given amount of incident light on these solar substrings at any instant in time.

4. Power Level Pair

As shown in FIG. 1, the system 100 includes a set of power level pairs, each including: a first (lower) power level; a second (upper) power level; a set of transistors and capacitors; and a winding of an inductor that accumulates energy from a connected solar substring(s), couples to windings in other power level pairs to balance the voltages across each power level pair, and interfaces with the set of transistors and capacitors in the power level pair to balance voltages across the first and second power levels.

4.1 First Power Level Pair

In one example implementation, a first power level pair 122 includes: a first junction 122a coupled to a ground rail; a second junction 122b coupled to the first junction 122a via a first capacitor 152 (hereinafter an "odd" or smoothing capacitor); a first transistor 142 (e.g., a MOSFET) including a first source 142a (or drain) connected to the ground rail, a first drain 142b (or source), and a first gate 142c connected to a first control output of the controller 210; and a second transistor 144 including a second source 144a (or drain) connected to the first drain 142b of the first transistor 142, a second drain 144b (or source) connected to the second junction 122b, and a second gate 144c connected to a second control output of the controller 210 (e.g., including a gate drive, clock, etc.)—180° out of phase with the first control output. Furthermore, in this example implementation: the first drain 142b of the first transistor 142 and the second source 144a of the second transistor 144 are connected to the first junction 122a via a first winding 132 of the transformer 130; and the second drain 144b of the second transistor 144 is connected to the second junction 122b via a second capacitor 154 (hereinafter an "even" capacitor).

In particular, in this example implementation, the first transistor 142, the first capacitor 152, and the first junction 122a and second junction 122b are connected in parallel; the first transistor 142 and second transistor 144 are connected in series; and the first capacitor 152 and second capacitor 154 are connected in series.

In one variation of the example implementation shown in FIG. 2, the system 100 can include grounded capacitors 200. For example, the first power level pair 122 can also include a first grounded capacitor 201 coupled to the second junction 122b and connected to the ground rail. In this variation of the example implementation, the first transistor 142, the first capacitor 152, the first grounded capacitor 201, and the first junction 122a and second junction 122b are connected in parallel; the first transistor 142 and second transistor 144 are connected in series; and the first capacitor 152 and the second capacitor 154 are connected in series. The grounded capacitor can be incorporated into the system 100 to improve high frequency filtering. In another variation, the system 100 can include only the first grounded capacitor 201 and exclude the first capacitor 152 and the second capacitor 154.

Thus, the first transistor 142 and second transistor 144 alternate connectivity between the first and second power levels across the ground rail and the second junction 122b. The first winding 132: is energized by a solar substring connected to the first junction 122a and second junction 122b and/or by other windings in the transformer 130; drives the voltage across the first junction 122a and second junction 122b to a nominal operating voltage of at least one solar substring connected to the system 100 during a high inductive drive stage (described below) controlled by the controller 210; drives the voltage across the second capacitor 154 to a nominal operating voltage of at least one solar substring connected to the system 100 during a low inductive drive stage (described below) controlled by the controller 210; and stores energy—output by a solar substring(s) connected to the first and/or second power levels and remaining after balancing the voltages across the first and second power levels—in the core of the transformer 130.

4.2 Second Power Level Pair

In the foregoing example implementation, a second power level pair 124 includes: a third junction 124a coupled between the second capacitor 154 and the second drain 144b of the second transistor 144; a fourth junction 124b coupled to the third junction 124a via a third capacitor 172; a third transistor 162 (e.g., a MOSFET) including a third source 162a (or drain) connected to the ground rail, a third drain 162b (or source), and a third gate 162c connected to a third control output of the controller 210; and a fourth transistor 164 including a fourth source 164a (or drain) connected to the third drain 162b of the third transistor 162, a fourth drain 164b (or source) connected to the fourth junction 124b, and a fourth gate 164c connected to a fourth control output of the controller 210—180° out of phase with the third control output. Furthermore, in this example implementation: the third drain 162b of the third transistor 162 and the fourth source 164a of the fourth transistor 164 are connected to the third junction 124a via a second winding 134 of the transformer 130; and the fourth drain 164b of the fourth transistor 164 is connected to the fourth junction 124b via a fourth capacitor 174.

In particular, in this example implementation, the third transistor 162, the third capacitor 172, and the third junction 124a and fourth junction 124b are connected in parallel; the third transistor 162 and fourth transistor 164 are connected in series; and the third capacitor 172 and fourth capacitor 174 are connected in series.

In one variation of this example implementation shown in FIG. 2, the second power level pair 124 can also include: a second grounded capacitor 202 coupled to the third junction 124a and connected to the ground rail; and a third grounded capacitor 203 coupled to the fourth junction 124b and connected to the ground rail. In particular, in this variation of the example implementation: the second transistor 144, the second capacitor 154, the second grounded capacitor 202, and the second junction 122b and third junction 124a are connected in parallel; the third transistor 162, the third capacitor 172, the third grounded capacitor 203, and the third junction 124a and fourth junction 124b are connected in parallel; the third transistor 162 and fourth transistor 164 are connected in series; and the third capacitor 172 and fourth capacitor 174 are connected in series. The second grounded capacitor 202 can be incorporated into the system 100 to improve high frequency filtering. In another variation of the example implementation, the system 100 can only include the second grounded capacitor 202 and the third grounded capacitor 203 and exclude the third capacitor 172 and the fourth capacitor 174.

Thus, the first transistor 142 and second transistor 144 alternate connectivity between the first and second power levels across the ground rail and the second junction 122b.

Thus, the third transistor 162 and fourth transistor 164 alternate connectivity between the third and fourth power levels across the third junction 124a and fourth junction 124b. The second winding 134: is energized by a solar substring connected to the third junction 124a and fourth junction 124b and/or by other windings in the transformer 130; drives the voltage across the third junction 124a and fourth junction 124b to a nominal operating voltage of at least one solar substring connected to the system 100 during a high inductive drive stage (described below) controlled by the controller 210; drives the voltage across the fourth capacitor 174 to a nominal operating voltage of at least one solar substring connected to the system 100 during a low inductive drive stage (described below) controlled by the controller 210; and stores energy—output by a solar substring(s) connected to the third and/or fourth power levels and remaining after balancing the voltages across the third and fourth power levels—in the core of the transformer 130.

4.3 Additional Power Level Pair

The system 100 can include additional, similar power level pairs above the first power level pair 122 and second power level pair 124.

4.4 Last Power Level Pair

For an example implementation of the system 100 including three power level pairs (i.e., six power levels), the third (i.e., last) power level pair can include a third power level pair 126 coupled to a fifth solar substring 115 and/or a sixth solar substring 116. The system 100 can also include a third pair of switches 180 arranged in series and a third pair of capacitors 190 arranged in series. Furthermore, the system can also include: a fifth junction 126a coupled between the fourth capacitor 174 and the fourth drain 164b of the fourth transistor 164; a sixth junction 126b coupled to the fifth junction 126a via an fifth capacitor 192; a fifth transistor 182 (e.g., a MOSFET) including an fifth source 182a (or drain) connected to the ground rail, an fifth drain 182b (or source), and an fifth gate 182c connected to an fifth control output of the controller 210; and a sixth transistor 184 including a sixth source 184a (or drain) connected to the fifth drain 182b of the fifth transistor 182, a sixth drain 184b (or source) connected to the sixth junction 126b, and a sixth gate 184c connected to a sixth control output of the controller 210—180° out of phase with the fifth control output. Furthermore, in this example implementation: the fifth drain 182b of the fifth transistor 182 and the sixth source 184a of the sixth transistor 184 are connected to the fifth junction 126*a* via a third winding 136 of the transformer 130; and the sixth drain 184*b* of the sixth transistor 184 is connected to the sixth junction 126*b* via a sixth capacitor 194.

In particular, in this example implementation, the fifth transistor 182, the fifth capacitor 192, and the fifth junction 126*a* and sixth junction 126*b* are connected in parallel; the fifth transistor 182 and sixth transistor 184 are connected in series; and the fifth capacitor 192 and sixth capacitor 194 are connected in series.

In one variation of this example implementation shown in FIG. 2, the third power level pair 126 can also include: a fourth grounded capacitor 204 coupled to the fifth junction 126*a* and connected to the ground rail; and a fifth grounded capacitor 205 coupled to the sixth junction 126*b* and connected to the ground rail. In particular, in this variation of the example implementation: the fourth transistor 164, the fourth capacitor 174, the fourth grounded capacitor 204, and the fourth junction 124*b* and fifth junction 126*a* are connected in parallel; the fifth transistor 182, the fifth capacitor 192, the fifth grounded capacitor 205, and the fifth junction 126*a* and sixth junction 126*b* are connected in parallel; the fifth transistor 182 and sixth transistor 184 are connected in series; and the fifth capacitor 192 and sixth capacitor 194 are connected in series. The second grounded capacitor 202 can be incorporated into the system 100 to improve high frequency filtering. In this variation of this implementation, the third power level pair 126 can also include a seventh junction 126*c* coupled between the sixth capacitor 194 and the second drain 144*b* of the sixth transistor 184. Furthermore, in this variation of the example implementation, the third power level can include a sixth grounded capacitor 206 coupled to the seventh junction 126*c* and connected to the ground rail. In particular, in this variation of the implementation, the sixth transistor 184, the sixth capacitor 194, the sixth grounded capacitor 206, and the sixth and seventh junction 126*c*s are connected in parallel.

Thus, the fifth transistor 182 and sixth transistor 184 cooperate with the sixth capacitor 194 to alternate connectivity between the fifth and six power levels across the fifth junction 126*a* and sixth junction 126*b*. The third winding 136: is energized by a solar substring connected to the fifth junction 126*a* and sixth junction 126*b* and/or by other windings in the transformer 130; drives the voltage across the fifth junction 126*a* and sixth junction 126*b* to a nominal operating voltage of at least one solar substring connected to the system 100 during a high inductive drive stage (described below) controlled by the controller 210; drives the voltage across the sixth capacitor 194 to a nominal operating voltage of at least one solar substring connected to the system 100 during a low inductive drive stage (described below) controlled by the controller 210; stores energy—output by a solar substring(s) connected to the fifth and/or sixth power levels and remaining after balancing the voltages across the fifth and sixth power levels—in the core of the transformer 130; and converts energy stored in the transformer 130 core into current output to a load 270 connected to the power rail during low inductive drive stages controlled by the controller 210.

5. Power Level Pair Coupling

The system 100 also includes a transformer 130 containing one winding per power level pair. As described below, the transformer 130 functions: to drive each even power level (i.e., the first, third, and fifth . . . power levels) to a common "even" voltage; and to drive each odd power level (i.e., the second, fourth, and sixth . . . power levels) to a common "odd" voltage. (The controller 210 can vary the duty cycle at which the transistors in each power level pair are switched in order to control the ratio between the common even and odd voltages, as described below.)

The system 100 is described below as including three power level pairs, each connected to one winding within a three-winding transformer 130. However, the system 100 can include any other number of power level pairs and a transform containing any other number of windings.

6. Controller and Clock

The controller 210 outputs oscillating first and second control signals—such as approximating square waves 180° out of phase—to transistor pairs in each power level pair in order to switch states of these transistors, thereby oscillating current flow through a winding in a power level pair, driving voltages across power levels in the power level pair, and driving the winding in the power level pair to couple to other windings in the transformer 130.

In particular, the controller 210 drives gates of the transistors at an operating frequency tuned to the resonant frequency of an LC-circuit formed by a winding and a capacitor in each power level pair. The controller 210 also drives gates of the transistors at a fixed or variable duty cycle, which controls the ratio of voltage across the odd power level to the voltage across the even power level in each power level pair, as described below.

7. Half-Level Balancing

In a half-level configuration shown in FIG. 1, a solar substring is connected to every even power level (i.e., the second, fourth, sixth . . . power levels); and a solar substring is omitted from every odd power level (i.e., the first, third, fifth . . . power levels).

7.1 First High Inductive Drive Stage

Generally, in this configuration, the controller 210 drives the first control signal to a voltage "HI" state and drives the second control signal to a voltage "LO" state (hereinafter a "high inductive drive stage") during a first high inductive drive stage, thereby setting all odd transistors to closed (or "ON") states and all even transistors to open (or "OFF") states. If a first solar substring 111 connected to the first power level is illuminated, the first solar substring 111 produces a nominal operating voltage (e.g., 1.0V) across the first junction 122*a* and second junction 122*b* of the first power level pair 122. During this first high inductive drive stage, the first transistor 142 couples the transistor-side of the first winding 132 of the transformer 130 to ground, which produces a voltage change in a first direction (or "first polarity") across the first winding 132 of the transformer 130 up to the nominal operating voltage, and current output by the first solar substring 111 therefore flows in the first direction through the first winding 132 of the transformer 130.

This AC signal passing through the first winding 132 also causes the first winding 132 to couple to each other winding in the transformer 130 and to drive these other windings to the same nominal operating voltage in the first direction, thereby increasing the voltage across any other solar substring—connected to an odd power level in the system 100—that is currently shaded or otherwise outputting a lower voltage than the first solar substring 111.

7.2 First Low Inductive Drive Stage

The controller 210 then sets the odd transistors to open states and the even transistors to closed states during a first low inductive drive stage. Current flowing through the first winding 132 of the transformer 130 during the preceding high inductive drive stage continues to flow through the first winding 132 (i.e., due to inductance of the first winding 132) and passes through the second transistor 144. The illuminated first solar substring 111 continues to output current, which also flows toward the first winding 132 and through the second transistor 144 during this low inductive drive stage. This energy is then stored on the second capacitor 154 and produces a voltage across the second capacitor 154.

In particular, if the controller 210 switches between the high and low inductive drive stages at 50% duty (i.e., 50% of each cycle in the high inductive drive stage and 50% of each cycle in the low inductive drive stage), this transition from the high inductive drive stage to the low inductive drive stage produces a voltage across the second capacitor 154 approaching or equal to the voltage across the first solar substring 111 (i.e., a 1:1 voltage ratio between the first and second power levels)—that is, the nominal operating voltage of the first solar substring 111. (The voltage between the ground rail and the third junction 124a thus approaches or equals twice the operating voltage of the first solar substring 111.)

Alternatively, if the controller 210 switches between the high and low inductive drive stages at 75% duty (i.e., 75% of each cycle in the high inductive drive stage and 25% of each cycle in the low inductive drive stage), transition from the high inductive drive stage to the low inductive drive stage produces a voltage across the second capacitor 154 equal to three times (i.e., 0.75:0.25) the voltage across the first solar substring 111 (i.e., a 1:3 voltage ratio between the first and second power levels)—that is, three times the nominal operating voltage of the first solar substring 111. (The voltage between the ground rail and the third junction 124a thus approaches or equals four times the operating voltage of the first solar substring 111.)

Yet alternatively, if the controller 210 switches between the high and low inductive drive stages at 40% duty (i.e., 40% of each cycle in the high inductive drive stage and 60% of each cycle in the low inductive drive stage), transition from the high inductive drive stage to the low inductive drive stage produces a voltage across the second capacitor 154 equal to two-thirds (i.e., 0.40:0.60) the voltage across the first solar substring 111 (i.e., a 3:2 voltage ratio between the first and second power levels)—that is, two-thirds the nominal operating voltage of the first solar substring 111. (The voltage between the ground rail and the third junction 124a thus approaches or equals 1.67 times the operating voltage of the first solar substring 111.)

Furthermore, this voltage across the second capacitor 154 results in a change (i.e., a reversal) in voltage across the first winding 132 in a second direction (or "second polarity"). The first winding 132 therefore couples to the other windings in the transformer 130 and drives these other windings to (or near) the voltage across the second capacitor 154, thereby inducing a similar voltage across each other even capacitor—and therefore across each other even power level—in the system 100.

The illumination of the first solar substring 111 and oscillation of the states of the first transistor 142 and second transistor 144 thus oscillates the polarity of the first winding 132 or inductor at the operating frequency of the system 100. Accordingly, the six power level pairs cooperate to drive the voltage between the power and ground rails to the sum of the voltages across the six solar substrings and the six odd capacitors—that is: 12 times the nominal operating voltage when the system 100 operates at 50% duty; 24 times the nominal operating voltage when the system 100 operates at 75% duty; or 10 times the nominal operating voltage when the system 100 operates at 25% duty.

Furthermore, with the voltage across the second capacitor 154 thus driven to the voltage across the first solar substring 111, the first winding 132 stores remaining energy output by the first solar substring in during this low inductive drive stage in the core of the transformer 130.

7.3 Next High Inductive Drive Stage

The controller 210 then sets all odd transistors to closed states and all even transistors to open states during a next high inductive drive stage. With the first solar substring 111 remaining illuminated, the first solar substring 111 continues to operate at the nominal operating voltage. With the second capacitor 154 now charged and holding the nominal operating voltage induced during the preceding high inductive drive stage, the first winding 132 stores energy output by the first solar substring in during the current high inductive drive stage in the core of the transformer 130.

Furthermore, if the second solar substring 112 is also illuminated, the second solar substring 112 outputs a voltage similar to the first solar substring 111 (i.e., the nominal operating voltage). The third transistor 162 couples the transistor-side of the second winding 134 of the transformer 130 to the second capacitor 154 and to the third junction 124a, thereby producing a voltage change in the first direction across the second winding 134 of the transformer 130 up to the nominal operating voltage. Current output by the second solar substring 112 therefore flows in the first direction through the second winding 134 of the transformer 130. Because the first solar substring 111 and second solar substring 112 are similarly illuminated and operating at similar nominal operating voltages, the voltages across the first winding 132 and second winding 134 are similar, and minimal or no energy is exchanged between the first power level pair 122 and second power level pair 124 via the transformer 130.

Alternatively, if the second solar substring 112 is shaded during the current high inductive drive stage, the second solar substring 112 outputs little or no power. The third transistor 162 couples the second winding 134 of the transformer 130 across the second solar substring 112 in this high inductive drive stage. Because the first winding 132 and second winding 134 are coupled, the transformer 130 drives the voltage across the second winding 134—and therefore across the second solar substring 112—to the nominal operating voltage of the first solar substring 111.

7.4 Next Low Inductive Drive Stage

During a next low inductive drive stage, the controller 210 sets all odd transistors to open states and all even transistors to closed states; current flowing through the second winding 134 of the transformer 130 during the previous high inductive drive stage continues to flow through the second winding 134 (i.e., due to inductance of the first winding 132) and passes through the fourth transistor 164 to drive the voltage across the fourth capacitor 174 to the nominal output voltage of the first solar substring 111.

7.5 Multi-Level Operation

Therefore, in this configuration, the windings of the transformer 130 cooperate to: drive the odd capacitors to the nominal operating voltage of the solar substrings; store energy output by illuminated solar substrings in the transformer 130 core; and transform energy stored in the transformed core into current output to a connected load 270 via the sixth power level pair during high inductive drive stages.

For example, if the six solar substrings are similarly illuminated, each solar substring outputs power of similar magnitude, such as 1 Watt output per solar substring given a nominal solar substring operating voltage of 1.0 Volt and a nominal solar substring output current of 1 Amp when illuminated for a total of 6 Watts output by the six solar substrings when illuminated. When the system 100 operates at 50% duty, the six power level pairs cooperate to produce approximately 12.0 Volts across the power and ground rails. The sixth winding in the transformer 130 converts energy stored in the transformer 130 core into an average current output to the load 270 of 0.5 Amps for a total power output of approximately 6 Watts.

However, in this example, if only two of the six solar substrings are similarly illuminated and the remainder are shaded, each illuminated solar substring produces 1 Watt of output power for a total of 2 Watts output across the six solar substrings. When the system 100 operates at 50% duty, the six power level pairs cooperate to produce an output of approximately 12.0 Volts across the power and ground rails. The sixth winding in the transformer 130 converts energy stored in the transformer 130 core into an average current output to the load 270 of 0.16 Amps for a total power output of approximately 2 Watts.

Similarly, in this example, if only one of the six solar substrings is illuminated and the remainder are shaded, the single illuminated solar substring produces 1 Watt of output power for a total of 1 Watt output across the six solar substrings. When the system 100 operates at 50% duty, the six power level pairs cooperate to produce an output of approximately 12.0 Volts across the power and ground rails. The sixth winding in the transformer 130 converts energy stored in the transformer 130 core into an average current output to the load 270 of 0.08 Amps for a total power output of approximately 0.1 Watts.

7.6 MPPT

In another example implementation, the controller 210 can: implement maximum power point tracking techniques to monitor a voltage and/or current demand of a load 270, such as a battery; and then adjust the duty cycle in order to match the voltage and/or current output to demands of the load 270.

For example, as described above, the controller 210 can: increase the duty cycle to increase the total voltage output of the system 100 and reduce the current output to the load 270; and decrease the duty cycle to decrease the total voltage output of the system 100 and increase the current output to the load 270.

In one variation of the example implementation, the system 100 can include a maximum power point tracking sensor 260 coupled to the inductive balancer circuit 120, and a load 270 connected to the total output voltage of the system 100. The controller 210 can be configured to: access a voltage load threshold for the load 270; access a first voltage reading for the load 270; and decrease the first duty cycle to a second duty cycle less than the first duty cycle, in response to the voltage reading exceeding the voltage threshold.

In another variation of the example implementation, the controller 210 can: implement maximum power point tracking techniques to monitor a first voltage output for the first power level pair 122, and a second voltage output for the second power level pair 124. The controller 210 can be configured to: access a target balance voltage threshold for the first voltage output and the second voltage output; access the first voltage output of the first power level pair 122; access the second voltage output for the second power level pair 124; and terminate a balancing cycle in response to the first voltage output and the second voltage output falling within the target balance voltage threshold. Similarly, the controller 210 can also initiate the balancing cycle in response to the first voltage output and the second voltage output falling out of the target balance threshold.

8. Temperature Tracking

In another example implementation, the controller 210 can: implement temperature tracking techniques to monitor a temperature of the inductive balancer circuit 120 and/or a load 270, such as a battery; and then adjust the duty cycle or terminate the balancing cycle in order to match a target temperature.

In one variation of the example implementation, the system 100 can include a temperature sensor 250 coupled to the inductive balancer circuit 120, and the load 270. The controller 210 can be configured to: access a temperature threshold for the load 270; access a first temperature reading for the load 270; and decrease the first duty cycle to a second duty cycle less than the first duty cycle, in response to the temperature reading exceeding the temperature threshold.

In another variation of the example implementation, the controller 210 can regularly monitor temperature readings of the first power level pair 122 and the second power level pair 124 to prevent overheating and failure of the inductive balancing circuit. The controller 210 can be configured to: access a target temperature threshold for the first power level pair 122 and the second power level pair 124; access a first temperature reading for the first power level pair 122; access a second temperature reading for the second power level pair 124; and terminate a balancing cycle in response to the first voltage output and/or the second voltage output exceeding the target temperature threshold. Similarly, the controller 210 can also initiate the balancing cycle in response to the first voltage output and/or the second voltage output falling below the target temperature threshold.

9. Full-Level Balancing

In another configuration shown in FIG. 2, one solar substring—of a common solar cell chemistry—is connected to each power level.

9.1 Odd Illuminated and Even Shaded Solar Substrings within One Power Level Pair The controller 210 drives the first control signal to a voltage "HI" state and drives the second control signal to a voltage "LO" state during a first high inductive drive stage, thereby setting all odd transistors to closed (or "ON") states and all even transistors to open (or "OFF") states. In this configuration, if a first solar substring 111 connected to the first power level is illuminated, the first solar substring 111 produces a nominal operating voltage (e.g., 1.0V) across the first junction 122a and second junction 122b of the first power level pair 122. However, if a second solar substring 112 connected to the second power level in the first power level pair 122 is shaded, the second solar substring 112 produces less or no voltage across the second junction 122b and third junction 124a. Therefore, during this first high inductive drive stage, the first transistor 142 couples the transistor-side of the first winding 132 of the transformer 130 to ground, which produces a voltage change in a first direction (or "first polarity") across the first winding 132 of the transformer 130 up to the nominal operating voltage, and current output by the first solar substring 111 therefore flows in the first direction through the first winding 132 of the transformer 130.

This AC signal passing through the first winding 132 also causes the first winding 132 to couple to each other winding in the transformer 130 and to drive these other windings to the same nominal operating voltage in the first direction, thereby increasing the voltage across any other solar substring—connected to an odd power level in the system 100—that is currently shaded or otherwise outputting a lower voltage than the first solar substring 111.

The controller 210 then sets the odd transistors to open states and the even transistors to closed states during a first low inductive drive stage. Current flowing through the first winding 132 of the transformer 130 in the first direction during the preceding high inductive drive stage continues to flow through the first winding 132 (i.e., due to inductance of the first winding 132) and passes through the second transistor 144. The illuminated first solar substring 111 continues to output current, which also flows toward the first winding 132 and through the second transistor 144 during this low inductive drive stage. This energy is then stored on the second capacitor 154 and produces a voltage across the second solar substring 112.

In one variation of the example implementation, the illuminated first solar substring 111 continues to output current, which also flows toward the first winding 132 and through the second transistor 144 during this low inductive drive stage. This energy is then stored on the second capacitor 154 and the second grounded capacitor 202, and produces a voltage across the second solar substring 112. In this variation, the second capacitor 154 and the second grounded capacitor 202 are in a parallel configuration. Therefore, the second capacitor 154 and the second grounded capacitor 202 operate as a single capacitor reflecting the sum of the capacitance of the second capacitor 154 and the second grounded capacitor 202.

In particular, the controller 210 switches between the high and low inductive drive stages at 50% duty (i.e., 50% of each cycle in the high inductive drive stage and 50% of each cycle in the low inductive drive stage), which produces a voltage across the second capacitor 154 and the second solar substring 112 approaching or equal to the voltage across the first solar substring 111, thereby matching the voltages across the first solar substring 111 and second solar substring 112 of the same solar cell chemistry during this illumination condition.

Furthermore, this voltage across the second capacitor 154 results in a change (i.e., a reversal) in voltage across the first winding 132 in a second direction (or "second polarity"). The first winding 132 therefore couples to the other windings in the transformer 130 and drives these other windings to (or near) the voltage across the second capacitor 154, thereby inducing a similar voltage across each other even capacitor—and therefore across each other even power level and solar substring connected thereto—in the system 100.

9.2 Odd Shaded and Even Illuminated Solar Substrings within One Power Level Pair Conversely, if the first solar substring 111 is shaded and the second solar substring 112 is illuminated, the second transistor 144 couples the transistor-side of the first winding 132 of the transformer 130 to the second solar substring 112, which produces a voltage change in the second direction (or "second polarity") across the first winding 132 of the transformer 130 up to the nominal operating voltage of the second solar substring 112, and current output by the second solar substring 112 therefore flows in the second direction through the first winding 132 of the transformer 130 during a low inductive drive stage.

This AC signal passing through the first winding 132 also causes the first winding 132 to couple to each other winding in the transformer 130 and to drive these other windings to the same nominal operating voltage in the second direction, thereby increasing the voltage across any other solar substring—connected to an even power level in the system 100—that is currently shaded or otherwise outputting a lower voltage than the second solar substring 112.

The controller 210 then sets the odd transistors to closed states and the even transistors to open states during a high inductive drive stage. Current flowing through the first winding 132 of the transformer 130 in the second direction during the preceding low inductive drive stage continues to flow through the first winding 132 (i.e., due to inductance of the first winding 132), energizes the first capacitor 152, and drives the voltage across the first solar substring 111 to the nominal operating voltage.

In one variation of the example implementation, current flowing through the first winding 132 of the transformer 130 in the second direction during the preceding low inductive drive stage continues to flow through the first winding 132 (i.e., due to inductance of the first winding 132), energizes the first capacitor 152 and the first grounded capacitor 201, and drives the voltage across the first solar substring 111 to the nominal operating voltage. In this variation, the first capacitor 152 and the first grounded capacitor 201 are in a parallel configuration. Therefore, the first capacitor 152 and the first grounded capacitor 201 operate as a single capacitor reflecting the sum of the capacitance of the first capacitor 152 and the first grounded capacitor 201.

In particular, the controller 210 switches between the high and low inductive drive stages at 50% duty (i.e., 50% of each cycle in the high inductive drive stage and 50% of each cycle in the low inductive drive stage), which produces a voltage across the first capacitor 152 and the first solar substring 111 approaching or equal to the voltage across the second solar substring 112, thereby matching the voltages across the first solar substring in and second solar substring 112 of the same solar cell chemistry during this illumination condition.

9.3 Multi-Level Operation

In this configuration, if the six solar substrings are similarly illuminated, each solar substring outputs power of similar magnitude, such as 1 Watt output per solar substring given a nominal solar substring operating voltage of 1.0 Volt and a nominal solar substring output current of 1 Amp when illuminated for a total of 6 Watts output by the six solar substrings when illuminated. When the system 100 operates at 50% duty, the three power level pairs cooperate to produce approximately 6.0 Volts across the power and ground rails. The third winding 136 in the transformer 130 converts energy stored in the transformer 130 core into an average current output to the load 270 of 1.0 Amp for a total power output of approximately 6.0 Watts.

However, in this example, if only two of the six solar substrings are similarly illuminated and the remainder are shaded, each illuminated solar substring produces 1 Watt of output power for a total of 2 Watts output across the six solar substrings. When the system 100 operates at 50% duty, the six power level pairs cooperate to produce an output of approximately 6.0 Volts across the power and ground rails. The third winding 136 in the transformer 130 converts energy stored in the transformer 130 core into an average current output to the load 270 of 0.33 Amps for a total power output of approximately 2 Watts.

10. Multiple Solar Chemistries

In yet another configuration shown in FIG. 3: a first set of solar substrings of a first solar cell chemistry (e.g., conventional silicon crystalline) characterized by a first nominal operating voltage (e.g., 1.2 Volts) when illuminated are connected to the odd power levels in the system 100; and a second set of solar substrings of a second solar cell chemistry (e.g., perovskite) characterized by a second nominal operating voltage (e.g., 0.8 Volts) are connected to the even power levels.

In this configuration, the controller 210 can drive the transistors in the power level pairs at a non-equal duty cycle in order to achieve the first nominal operating voltage across the odd power levels (and therefore the first set of solar substrings) and to achieve the second nominal operating voltage across the even power levels (and therefore the second set of solar substrings) when at least one solar substring connected to the system 100 is illuminated.

In one example, each solar substring in the first set of solar substrings includes conventional silicon crystalline solar cells arranged in parallel and/or in series to yield a first nominal operating voltage of 1.2 Volts when illuminated. In this example, each solar substring in the second set of solar substrings includes perovskite solar cells arranged in parallel and/or in series to yield a second nominal operating voltage of 0.8 Volts when illuminated. In this example, the controller 210 switches between the high and low inductive drive stages at 40% duty (i.e., 40% of each cycle in the high inductive drive stage and 60% of each cycle in the low inductive drive stage). Transition from the high inductive drive stage to the low inductive drive stage therefore produces a voltage across the even power levels equal to two-thirds (i.e., 0.4:0.6) the voltage across the odd power levels (i.e., a 3:2 voltage ratio between the first and second power levels). More specifically, in this example, by oscillating the states of the odd and even transistors at 40% duty cycle, the system 100 can drive each odd solar substring containing conventional silicon crystalline solar cells to 1.2 Volts and drive each even solar substring containing perovskite solar cells to 0.8 Volts if at least one solar substring in the set is illuminated.

Furthermore, in this example, the system 100 can achieve a total output voltage of 12.0 Volts if at least one solar substring in the set is illuminated.

In another example, each solar substring in the first set of solar substrings contains a first quantity of solar cells of a particular solar cell chemistry and connected in parallel and/or in series to yield a first nominal operating voltage; and each solar substring in the second set of solar substrings contains a second quantity of solar cells—less than the first quantity—of the same solar cell chemistry and connected in parallel and/or in series to yield a second nominal operating voltage less than the first nominal operating voltage. In particular, in this example, the first set of solar substrings can include larger solar substrings, and the second set of solar substrings can include smaller solar substrings. However, the system 100 can balance the voltages and aggregate the power outputs of these two different groups of solar substrings by adjusting the duty cycle according to the difference between (e.g., a ratio of) the nominal operating voltages of these two different groups of solar substrings.

In yet another example implementation, a first solar substring 111 includes a first set of solar cells. The first set of solar cells can include a first solar cell chemistry operable at a first nominal operating voltage. Additionally, a second solar substring 112 includes a second set of solar cells less than the first set of solar cells. The second set of solar cells can include a second solar cell chemistry chemically distinct from the first solar cell chemistry, and operating at a second nominal operating voltage. In particular, in this example, the first set of solar cells and the second set of solar cells each include distinct quantities. Additionally, the first solar cell chemistry and the second solar cell chemistry are chemically distinct from each other. However, the system 100 can trigger the controller 210 to drive the first pair of switches 140 for a first power level pair 122 and the second pair of switches 160 for a second power level pair 124 to adjust the duty cycle according to a ratio of the nominal operating voltages of these two different groups of solar substrings.

The system and methods described herein can be embodied and/or implemented at least in part as a machine configured to receive a computer-readable medium storing computer-readable instructions. The instructions can be executed by computer-executable components integrated with the application, applet, host, server, network, website, communication service, communication interface, hardware/firmware/software elements of a user computer or mobile device, wristband, smartphone, or any suitable combination thereof. Other systems and methods of the embodiment can be embodied and/or implemented at least in part as a machine configured to receive a computer-readable medium storing computer-readable instructions. The instructions can be executed by computer-executable components integrated with apparatuses and networks of the type described above. The computer-readable medium can be stored on any suitable computer readable media such as RAMs, ROMs, flash memory, EEPROMs, optical devices (CD or DVD), hard drives, floppy drives, or any suitable device. The computer-executable component can be a processor but any suitable dedicated hardware device can (alternatively or additionally) execute the instructions.

As a person skilled in the art will recognize from the previous detailed description and from the figures and claims, modifications and changes can be made to the embodiments of the invention without departing from the scope of this invention as defined in the following claims.

I claim:

1. A system comprising:
a first solar panel comprising:
   a first solar substring; and
   a second solar substring; and
an inductive balancer circuit comprising:
   a first power level pair coupled to the first solar substring comprising:
      a first pair of switches arranged in series;
      a first pair of capacitors arranged in series and connected in parallel to the first pair of switches; and
      a first inductor arranged between the first pair of switches and the first pair of capacitors; and
   a second power level pair coupled to the second solar substring comprising:
      a second pair of switches arranged in series;
      a second pair of capacitors arranged in series and connected in parallel to the second pair of switches; and
      a second inductor arranged between the second pair of switches and the second pair of capacitors, connected to the first pair of switches and the first pair of capacitors; and
   a controller coupled to the inductive balancer circuit and configured to initiate a balancing cycle, during the balancing cycle:
      oscillate states of the first pair of switches and the second pair of switches at a first duty cycle;
      balance voltages across the first power level pair and the second power level pair; and
      generate a total voltage output that is a multiple of a nominal operating voltage of a most-illuminated solar substring.

2. The system of claim 1:
wherein the first power level pair further comprises:
   a first junction coupled to a ground rail; and
   a second junction coupled to the first junction via a first capacitor of the first pair of capacitors; and wherein the first pair of switches for the first power level pair comprises:
a first transistor comprising:
a first source connected to the ground rail;
a first drain; and
a first gate connected to a first control output of the controller; and
a second transistor comprising:
a second source connected to the first drain of the first transistor;
a second drain connected to the second junction; and
a second gate connected to a second control output of the controller, and 180° out of phase with the first control output.

3. The system of claim 2:
wherein the first drain of the first transistor and the second source of the second transistor are connected to the first junction via the first inductor for the first power level pair; and
wherein the second drain of the second transistor is connected to the second junction via a second capacitor of the first pair of capacitors.

4. The system of claim 3:
wherein the second power level pair further comprises:
a third junction coupled between the second capacitor and the second drain of the second transistor; and
a fourth junction coupled to the third junction via a third capacitor of the second pair of capacitors; and
wherein the second pair of switches for the second power level pair comprises:
a third transistor comprising:
a third source connected to the ground rail;
a third drain; and
a third gate connected to a third control output of the controller; and
a fourth transistor comprising:
a fourth source connected to the third drain of the third transistor;
a fourth drain connected to the fourth junction; and
a fourth gate connected to a fourth control output of the controller, and 180° out of phase with the third control output.

5. The system of claim 4:
wherein the third drain of the third transistor and the fourth source of the fourth transistor are connected to the third junction via the second inductor for the second power level pair;
wherein the fourth drain of the fourth transistor is connected to the fourth junction via a fourth capacitor of the second pair of capacitors;
wherein the first transistor and the second transistor are alternatively connected between a first power level and a second power level of the first power level pair across the ground rail and the second junction; and
wherein the third transistor and the fourth transistor are alternatively connected between a third power level and a fourth power level of the second power level pair across the second junction and the fourth junction.

6. The system of claim 2:
wherein the first power level pair further comprises:
a first power level; and
a second power level coupled to the first solar substring; and
wherein the controller is further configured to, at a first time, initiate a first high inductive drive stage, and during the first high inductive drive stage:
drive a first control signal directed to the first control output to a voltage HI state;
drive a second control signal directed to the second control output to a voltage LO state;
set the first transistor to an on-state; and
set the second transistor to an off-state.

7. The system of claim 6:
wherein during the first high inductive drive stage, the controller is further configured to:
induce a first nominal operating voltage for the first solar substring across the first junction and the second junction, in response to illumination of the first solar substring; and
couple a first transistor side of the first inductor to ground to:
generate a first voltage change in a first direction across the first inductor; and
direct a first current output by the first solar substring in the first direction through the first inductor.

8. The system of claim 7, wherein the controller is further configured to, at a second time, following the first time, initiate a first low inductive drive stage, and during the first low inductive drive stage:
drive a third control signal directed to the first control output to a voltage LO state;
drive a fourth control signal directed to the second control output to a voltage HI state;
set the first transistor to an off-state; and
set the second transistor to an on-state.

9. The system of claim 8:
wherein the second drain of the second transistor is connected to the second junction via a second capacitor of the first pair of capacitors; and
wherein during the first low inductive drive stage the controller is further configured to:
direct the first current output from the first inductor to the second transistor; and
generate a first voltage across the second capacitor.

10. The system of claim 1:
further comprising:
a first transformer coupled to the inductive balancer circuit comprising:
a first winding; and
a second winding;
wherein the first inductor arranged between the first pair of switches and the first pair of capacitors comprises the first winding; and
wherein the second inductor arranged between the second pair of switches and the second pair of capacitors comprises the second winding.

11. The system of claim 1:
further comprising:
a third solar substring; and
a fourth solar substring;
wherein the first power level pair further comprises:
a first power level coupled to the first solar substring; and
a second power level coupled to the third solar substring;
wherein the second power level pair further comprises:
a third power level coupled to the second solar substring; and
a fourth power level coupled to the fourth solar substring; and wherein the controller is further configured to, during the balancing cycle:
induce a fixed voltage boost ratio; and
generate a voltage output as a function of the ratio of each of the first, second, third, and fourth power levels, and the first duty cycle of the first pair of switches.

12. The system of claim 1:
wherein the first solar substring comprises a first quantity of solar cells of a first solar cell chemistry, and operable at a first nominal operating voltage;
wherein the second solar substring comprises a second quantity of solar cells less than the first quantity of solar cells, the second quantity of solar cells of a second solar cell chemistry chemically distinct from the first solar cell chemistry, and operating at a second nominal operating voltage; and
wherein the controller is further configured to, during the balancing cycle, drive the first pair of switches for each of the first power level pair and the second power level pair at a second duty cycle greater than the first duty cycle.

13. The system of claim 1:
further comprising a temperature sensor coupled to the inductive balancer circuit and the controller; and
wherein the controller is further configured to, during the balancing cycle:
access a first temperature threshold;
access a first temperature from the temperature sensor; and
terminate the balancing cycle, in response to the first temperature exceeding the first temperature threshold.

14. The system of claim 1:
further comprising a maximum power point tracking (MPPT) sensor coupled to the inductive balancer circuit, and a load connected to the total output voltage; and
wherein the controller is further configured to, during the balancing cycle:
access a first voltage load threshold;
access a first voltage reading for the load; and
decrease the first duty cycle to a second duty cycle, in response to the first voltage reading exceeding the first voltage threshold.

15. A system comprising:
a first solar panel comprising:
a first solar panel substring and a second solar panel substring defining a first pair of solar substrings; and
a third solar panel substring and a fourth solar panel substring defining a second pair of solar panel substrings; and
an inductive balancer circuit comprising:
a first power level pair coupled to the first pair of solar substrings comprising:
a first pair of switches arranged in series;
a first pair of capacitors arranged in series and connected in parallel to the first pair of switches; and
a first inductor arranged between the first pair of switches and the first pair of capacitors;
a second power level pair coupled to the second pair of solar substrings comprising:
a second pair of switches arranged in series;
a second pair of capacitors arranged in series and connected in parallel to the second pair of switches; and
a second inductor arranged between the second pair of switches and the second pair of capacitors, connected to the first pair of switches and the first pair of capacitors; and
a controller coupled to the inductive balancer circuit and configured to initiate a balancing cycle, during the balancing cycle:
oscillate states of the first pair of switches and the second pair of switches at a first duty cycle;
balance voltages across the first power level pair and the second power level pair;
induce a fixed voltage boost ratio; and
generate a total voltage output as a function of the ratio of each of the first power level pair, second power level pair, and the first duty cycle.

16. The system of claim 15:
wherein the first pair of solar substrings comprises a first quantity of solar cells of a first solar cell chemistry, and operable at a first nominal operating voltage;
wherein the second pair of solar substrings comprises:
a second quantity of solar cells less than the first quantity of solar cells;
a second solar cell chemistry chemically distinct from the first solar cell chemistry; and
a second nominal operating voltage less than the first nominal operating voltage; and
wherein the controller is further configured to, during the balancing cycle, drive the first pair of switches for each of the first power level pair and the second power level pair at a second duty cycle greater than the first duty cycle.

17. The system of claim 15:
wherein the first power level pair further comprises:
a first junction coupled to a ground rail; and
a second junction coupled to the first junction via a first capacitor of the first pair of capacitors; and
wherein the first pair of switches for the first power level pair comprises:
a first transistor comprising:
a first source connected to the ground rail;
a first drain; and
a first gate connected to a first control output of the controller; and
a second transistor comprising:
a second source connected to the first drain of the first transistor;
a second drain connected to the second junction; and
a second gate connected to a second control output of the controller, and 180° out of phase with the first control output.

18. The system of claim 17:
wherein the first power level pair further comprises:
a first power level coupled to the first solar substring; and
a second power level coupled to the second solar substring; and
wherein the controller is further configured to, at a first time, initiate a first high inductive drive stage, and during the first high inductive drive stage:
set the first transistor to an on-state;
set the second transistor to an off-state;
induce a first nominal operating voltage for the first solar substring across the first junction and the second junction, in response to:
a first illumination of the first solar substring; and
a second illumination of the second solar substring less than the first illumination; and couple a first transistor side of the first inductor to ground to:
    generate a first voltage change in a first direction across the first inductor; and
    direct a first current output by the first solar substring in the first direction through the first inductor.

19. The system of claim 18:
wherein the second drain of the second transistor is connected to the second junction via a second capacitor of the first pair of capacitors; and
wherein the controller is further configured to, at a second time following the first time, initiate a first low inductive drive stage, and during the first low inductive drive stage:
    set the first transistor to an off-state;
    set the second transistor to an on-state;
    direct the first current output from the first inductor to the second transistor; and
    generate a first voltage across the second capacitor.

20. The system of claim 15:
further comprising a maximum power point tracking (MPPT) sensor coupled to the inductive balancer circuit, and a load connected to the total output voltage; and
wherein the controller is further configured to, during the balancing cycle:
    access a first voltage load threshold;
    access a first voltage reading for the load;
    decrease the first duty cycle to a second duty cycle, in response to the first voltage reading exceeding the first voltage threshold; and
    increase the first duty cycle to a third duty cycle, in response to the first voltage reading falling below the first voltage threshold.

\* \* \* \* \*